(12) United States Patent
Kyle et al.

(10) Patent No.: US 7,433,176 B2
(45) Date of Patent: Oct. 7, 2008

(54) METHOD AND APPARATUS FOR SUPPORTING A CHASSIS COVER

(75) Inventors: Lawrence Alan Kyle, Salado, TX (US); Laurent Andy Regimbal, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 425 days.

(21) Appl. No.: 11/077,647

(22) Filed: Mar. 11, 2005

(65) Prior Publication Data

US 2006/0203435 A1  Sep. 14, 2006

(51) Int. Cl.
*H05K 5/00* (2006.01)
(52) U.S. Cl. ............................ 361/679; 361/685; 29/521
(58) Field of Classification Search ................. 361/679, 361/685; 29/521
See application file for complete search history.

(56) References Cited

U.S. PATENT DOCUMENTS 5,331,506 A * 7/1994 Nakajima .................... 361/683
5,629,823 A * 5/1997 Mizuta ........................ 360/133
5,845,977 A * 12/1998 Neukam et al. ........... 312/223.2
6,069,427 A * 5/2000 Strahm et al. ................. 310/89
6,120,118 A * 9/2000 Dean ......................... 312/223.2
6,445,578 B1 * 9/2002 Bell et al. .................... 361/685
6,671,179 B2 * 12/2003 Chen .......................... 361/725
2005/0168116 A1 * 8/2005 Chuang ...................... 312/265.5

* cited by examiner

*Primary Examiner*—Lisa Lea-Edmonds
*Assistant Examiner*—Ingrid Wright
(74) *Attorney, Agent, or Firm*—Haynes and Boone, LLP

(57) ABSTRACT

A chassis cover supporting apparatus includes a chassis having a plurality of chassis sides and including a cover support receiving member positioned between the chassis sides. A cover is operable to couple to the chassis by sliding engagement with the plurality of chassis sides. A cover support member is coupled to the cover, whereby in response to the sliding engagement of the cover with the chassis sides, the cover support member engages the cover support receiving member.

16 Claims, 10 Drawing Sheets

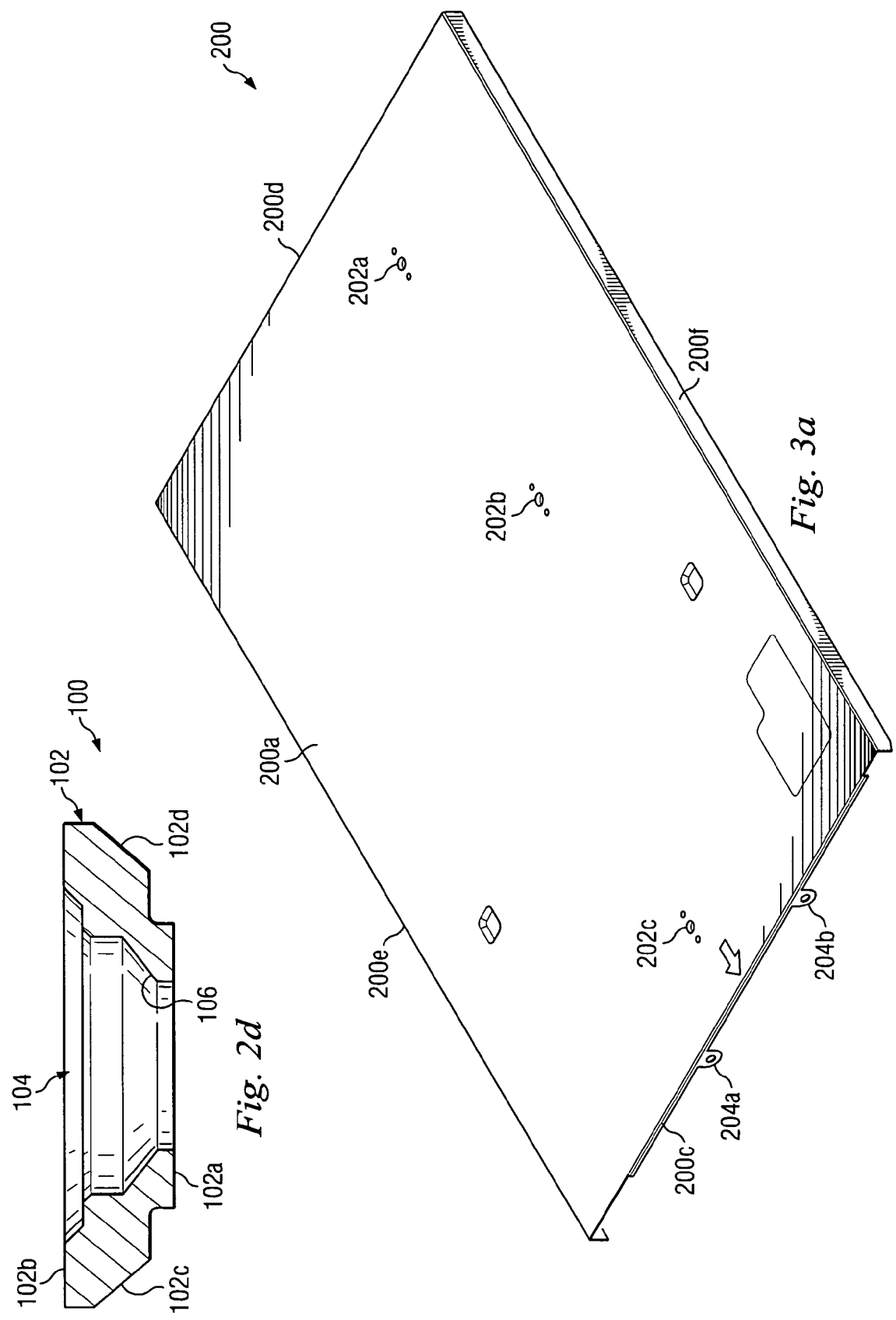

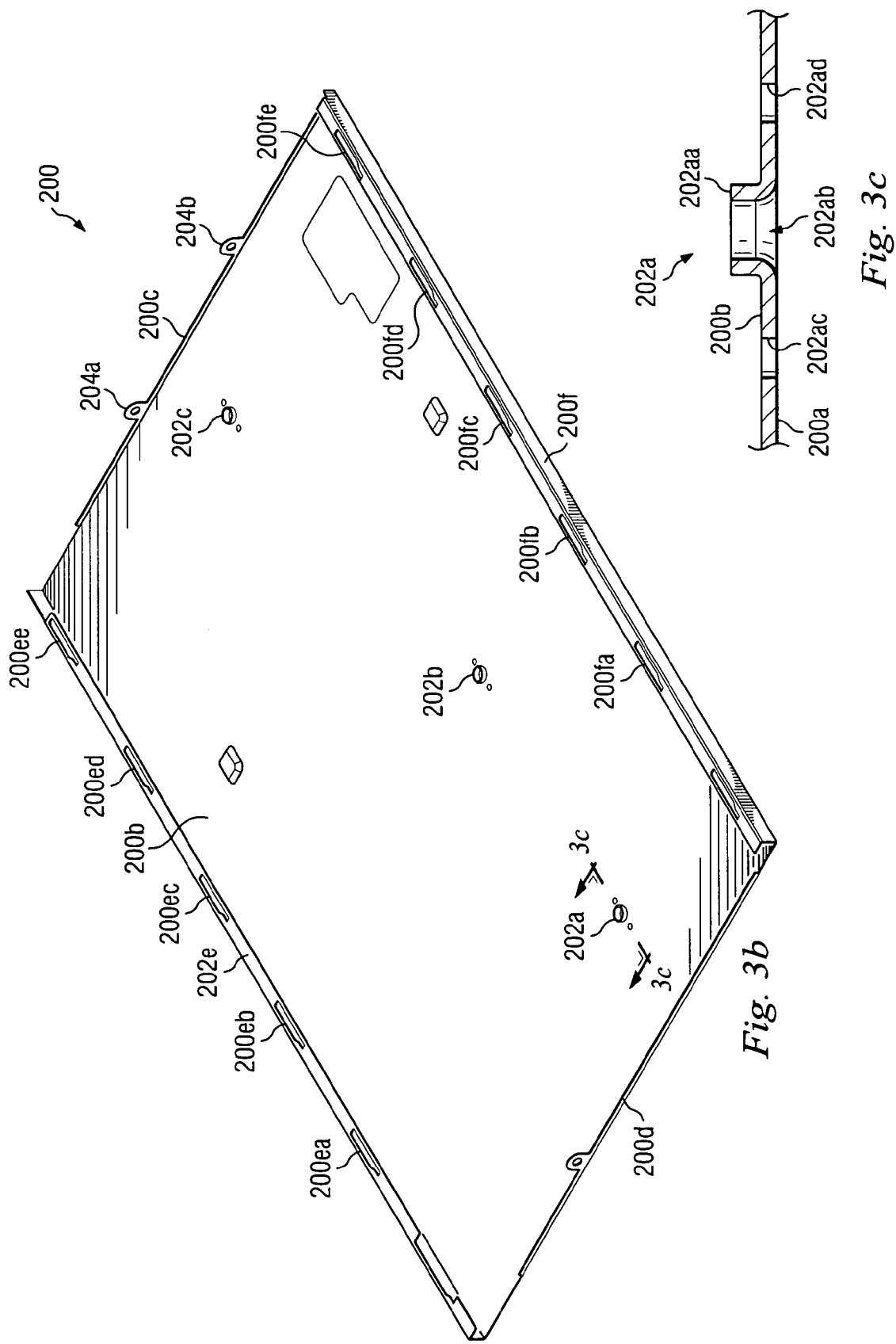

METHOD AND APPARATUS FOR SUPPORTING A CHASSIS COVER

BACKGROUND

The present disclosure relates generally to information handling systems, and more particularly to supporting a chassis cover.

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Some information handling systems such as, for example, rack mounted servers, include a chassis with a large access panel that couples to the sides of the chassis to prevent access to the components in the chassis. It is sometimes desirable to densely pack together a plurality of the information handling systems when they are mounted in a rack, making the overall thickness of the each system critical and raising a number of issues with respect to the supporting of these access panels.

Because these large access panels are coupled by their sides to the chassis, they tend to resonate and can create undesirable noise levels when components within the chassis such as, for example, cooling fans, are operated. Conventional methods for dealing with such acoustical problems include stiffening the panel by embossing areas of the panel. However, while such embossing increasing the resistance of the panel to bending, it also can increase the overall thickness of the system. In addition, for some systems, the internal space in the chassis needed for such embossing is needed for system components and is not available.

Another method for dealing with the acoustical problems with these panels is to engage the panel near its center from the inside of the chassis with a compliant member such as, for example, a piece of foam or rubber. While this solution helps to damp vibration of the panel, it also tends to induce an upward bow in the panel, which increases the overall thickness of the system.

Accordingly, it would be desirable to provide for supporting a chassis cover absent the disadvantages found in the prior methods discussed above.

SUMMARY

According to one embodiment, a chassis cover supporting apparatus is provided that includes a chassis having a plurality of chassis sides and including a cover support receiving member positioned between the chassis sides. A cover is operable to couple to the chassis by sliding engagement with the plurality of chassis sides. A cover support member is coupled to the cover, whereby in response to the sliding engagement of the cover with the chassis sides, the cover support member engages the cover support receiving member.

A principal advantage of this embodiment is that a cover may be supported on a chassis to limit vibration or deformation of the cover without increasing the overall thickness of the system.

BRIEF DESCRIPTION OF THE DRAWINGS

FIG. 2b is a cross sectional view illustrating an embodiment of the cover support member of FIG. 2a.

FIG. 2c is a bottom perspective view illustrating an embodiment of the cover support member of FIG. 2a.

FIG. 2d is a cross sectional view illustrating an embodiment of the cover support member of FIG. 2c.

FIG. 3a is a top perspective view illustrating an embodiment of a cover.

FIG. 3b is a bottom perspective view illustrating an embodiment of the cover of FIG. 3a.

FIG. 3c is a cross sectional view illustrating an embodiment of the cover of FIG. 3b.

FIG. 4b is a perspective view illustrating an embodiment of a cover support receiving member on the chassis of FIG. 4a.

FIG. 6a is a perspective view illustrating an embodiment of the cover of FIG. 5d engaging the chassis of FIG. 4a.

FIG. 6c is a perspective view illustrating an embodiment of the cover of FIG. 5d secured to the chassis of FIG. 4a.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

Figure 1:
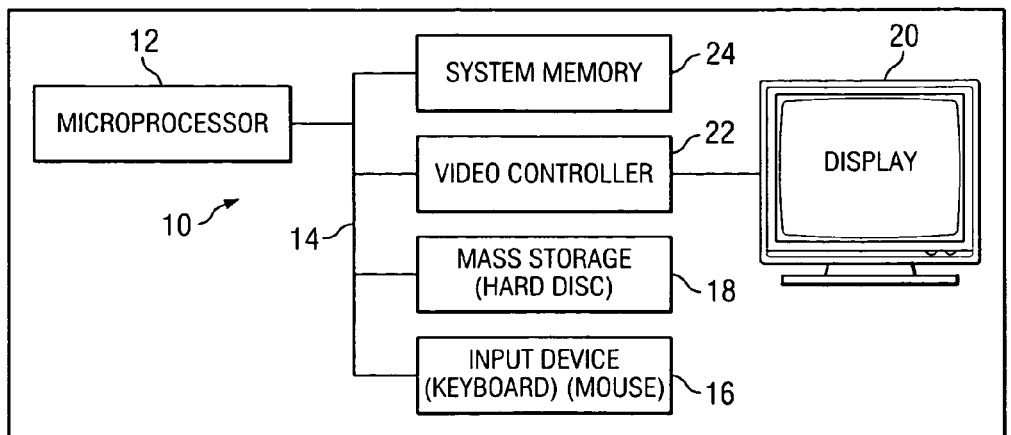
FIG. 1 is a schematic view illustrating an embodiment of an information handling system.
Figure 2A:
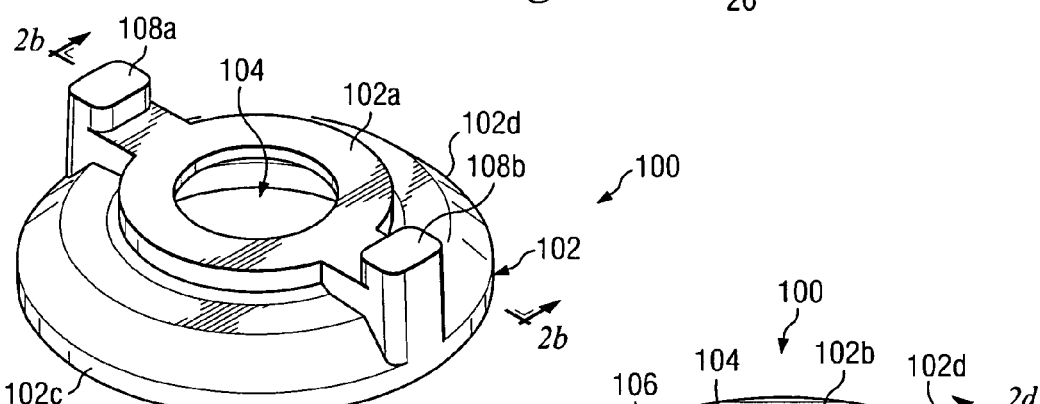
FIG. 2a is a top perspective view illustrating an embodiment of a cover support member.
Figure 2C:
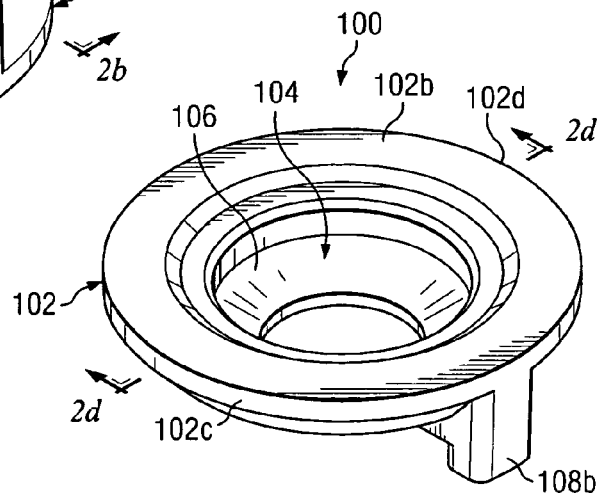
Figure 2B:
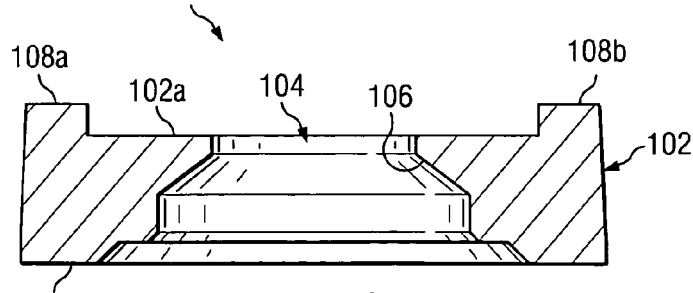

In one embodiment, information handling system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. In an embodiment, a chassis 26 houses some or all of the components of the information handling system 10. It should be understood that other busses and intermediate circuits can be deployed between the components described above and microprocessor 12 to facilitate interconnection between the components and the microprocessor.

Referring now to FIGS. 2a, 2b, 2c, and 2d, a cover support member 100 is illustrated. Cover support member 100 includes a substantially circular shaped base 102 having a top surface 102a, a bottom surface 102b located opposite the top surface 102a, and a plurality of securing lips 102c and 102d located on opposite sides of the base 102. The cover support member 100 defines a coupling passageway 104 extending through the base 102 from the top surface 102a to the bottom surface 102b. A securing surface 106 is positioned on the base 102 and in the coupling passageway 104. A plurality of guide arms 108a and 108b extend from the top surface 102a of the cover support member 100 and are located on opposite sides of the base 102 and the coupling passageway 104. In an embodiment, the cover support member 100 is made from a non-metal material such as, for example, rubber, plastic, or a variety of equivalent non-metal materials known in the art.

Referring now to FIGS. 3a, 3b, and 3c, a cover 200 is illustrated. Cover 200 includes a top surface 200a, a bottom surface 200b located opposite the top surface 200a, a front 200c, a rear 200d located opposite the front 200c, and a plurality of sides 200e and 200f extending between the front 200c and the rear 200d on opposite sides of the cover 200. Side 200e defines a plurality of coupling apertures 200ea, 200eb, 200ec, 200ed, and 200ee positioned in a spaced apart relationship along its length. Side 200f defines a plurality of coupling apertures 200fa, 200fb, 200fc, 200fd, and 200fe positioned in a spaced apart relationship along its length. A plurality of cover support coupling members 202a, 202b, and 202c are substantially centrally located on the cover 200 between the sides 200e and 200f. Cover support coupling member 202a, illustrated in detail in FIG. 3c, includes a securing lip 202aa extending from the bottom surface 200b of the cover 200 and defining a support member coupling aperture 202ab in the cover 200. In an embodiment, the cover 200 is made of a conventional sheet metal known in the art and the securing lip 202aa is formed by a conventional punch process on the sheet metal. A plurality of guide apertures 202ac and 202ad are defined by the cover 200, extend through the cover 200 from the top surface 200a to the bottom surface 200b, and are positioned on opposite sides of the securing lip 202aa and in a substantially parallel orientation with the sides 200e and 200f on the cover 200. Cover support coupling members 202b and 202c are substantially similar to the cover support coupling member 202a described above with reference to FIG. 3c. A plurality of securing tabs 204a and 204b extend from the bottom surface 200b and the front 200c of the cover 200. In an embodiment, the chassis 300 may include, for example, a rack mounted server known in the art.

Figure 4A:
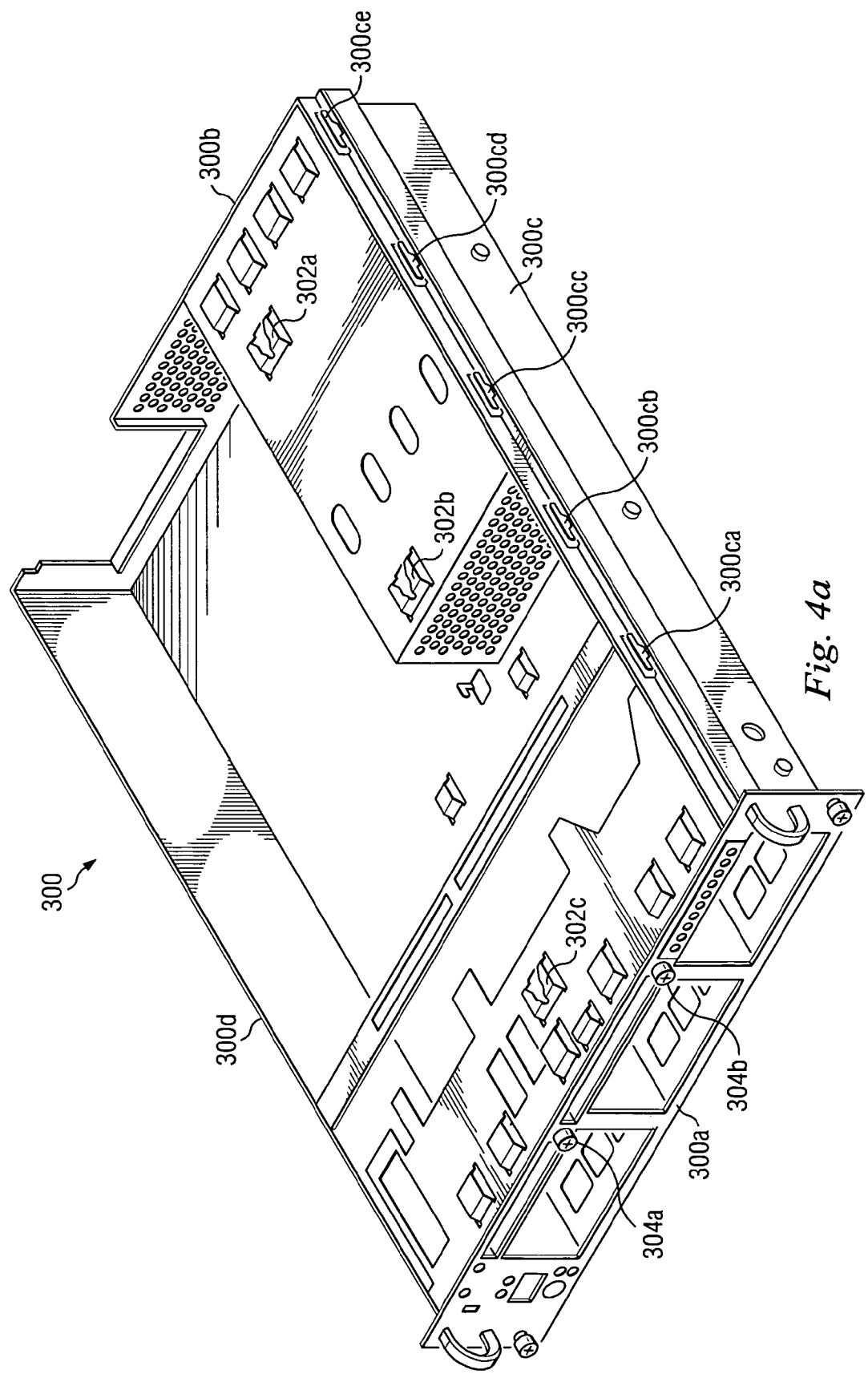
FIG. 4a is a perspective view illustrating an embodiment of a chassis.
Figure 4B:
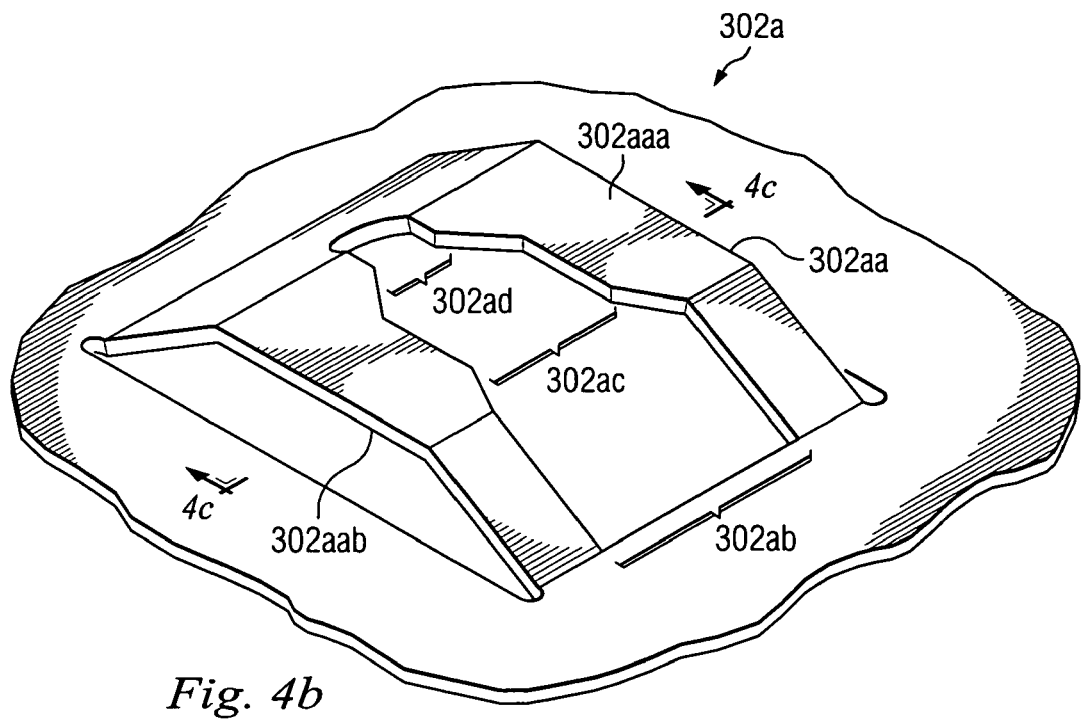
Figure 4C:
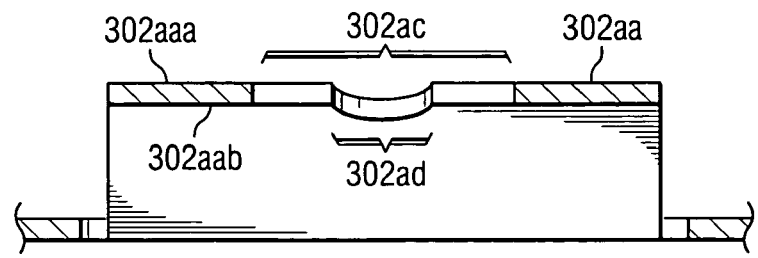
FIG. 4c is a cross sectional view illustrating an embodiment of the cover support receiving member of FIG. 4b.

Referring now to FIGS. 4a, 4b, and 4c, a chassis 300 is illustrated which may be, for example, the chassis 26 illustrated in FIG. 1, and may house components of an information handling system such as, for example, the information handling system 10 illustrated in FIG. 1. Chassis 300 includes a front 300a, a rear 300b located opposite the front 300a, and a plurality of sides 300c and 300d extending between the front 300a and the rear 300b. Side 300c includes a plurality of cover coupling tabs 300ca, 300cb, 300cc, 300cd, and 300ce, extending from the side 300c and in a spaced apart relationship along its length. Side 300d includes a plurality of cover coupling tabs (not shown) similar to cover coupling tabs 300ca, 300cb, 300cc, 300cd, and 300ce, extending from the side 300d and in a spaced apart relationship along its length. A plurality of cover support receiving members 302a, 302b, and 302c are substantially centrally located on the chassis 300 between sides 300c and 300d. Cover support receiving member 302a, illustrated in detail in FIGS. 4b and 4c, includes an embossed member 302aa which is raised from an upper surface of the chassis and includes a top surface 302aaa and a bottom surface 302aab located opposite the top surface 302aa. Embossed member 302aa defines an entry passageway 302ab and a securing passageway 302ac located adjacent the entry passageway 302ab. A guide arm channel 302ad is defined by the embossed member 302aa and is located adjacent the securing passageway 302ac. Cover support receiving members 302b and 302c are substantially similar to the cover support coupling member 302a described above with reference to FIGS. 4b and 4c. A plurality of securing members 304a and 304b are coupled to the front 300a of the chassis 300 and positioned in a spaced apart relationship from each other. In an embodiment, the securing members 304a and 304b are conventional threaded fasteners known in the art.

Figure 5A:
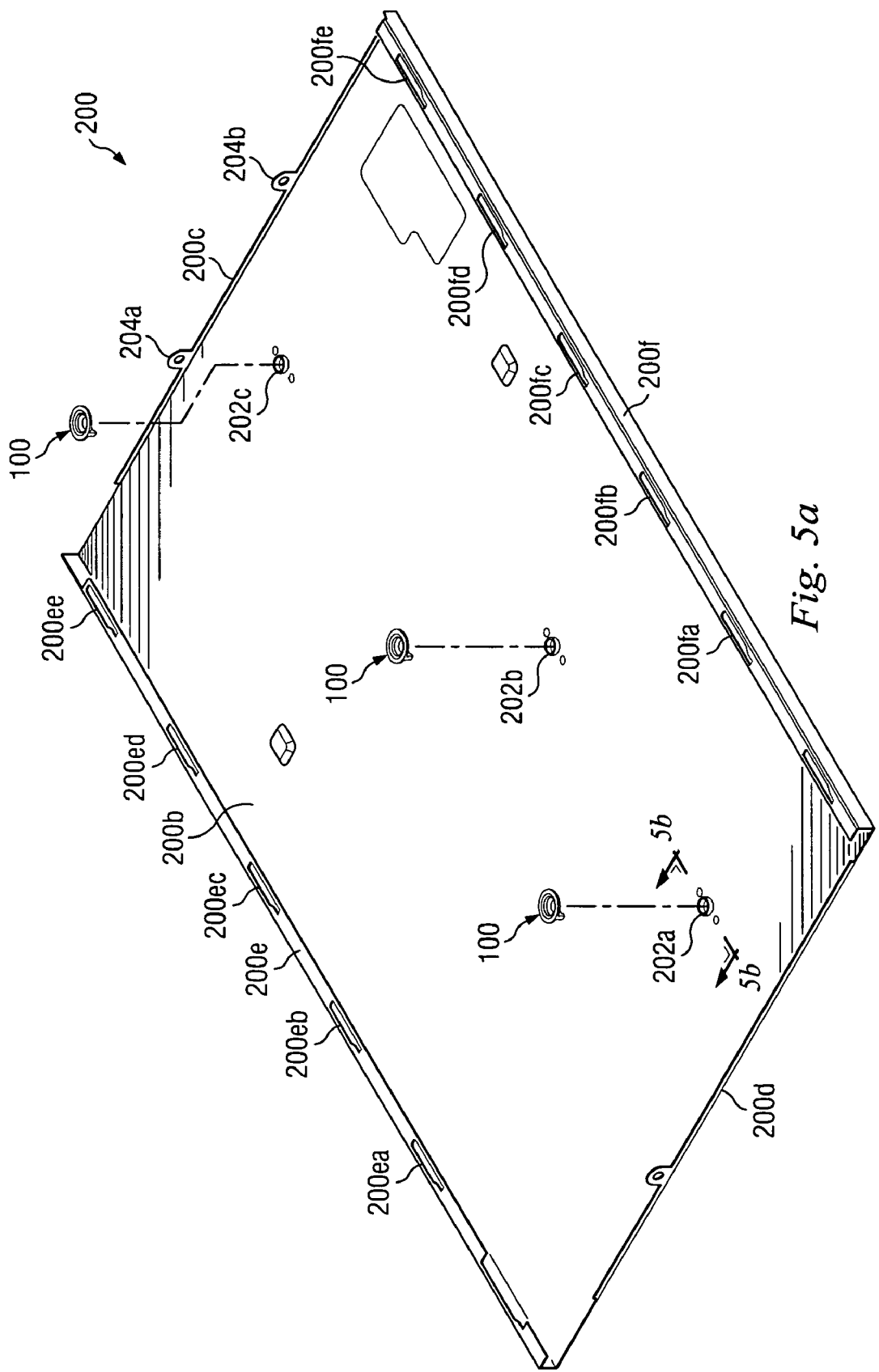
FIG. 5a is a perspective view illustrating an embodiment of a plurality of the cover support members of FIG. 2a being coupled to the cover of FIG. 3b.
Figure 5B:
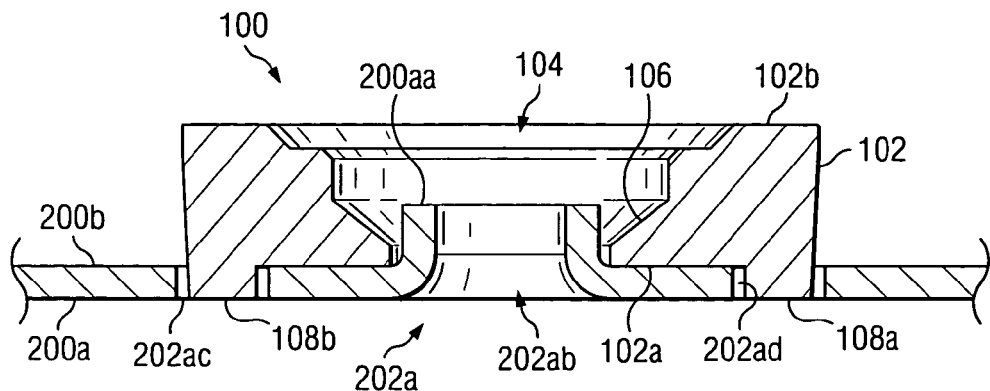
FIG. 5b is a cross sectional view illustrating an embodiment of the cover support member of FIG. 2b engaging to the cover of FIG. 3c.
Figure 5C:
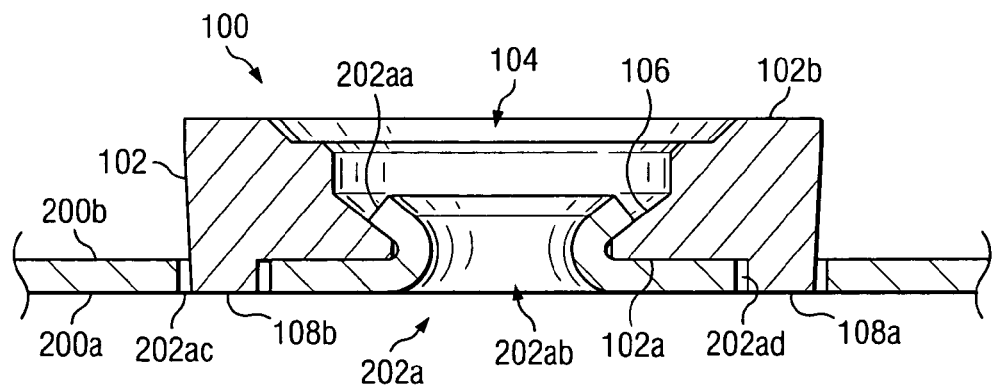
FIG. 5c is a cross sectional view illustrating an embodiment of the cover support member of FIG. 2b coupled to the cover of FIG. 3c.

Referring now to FIGS. 2a, 5a, 5b, 5c, and 5d, in assembly operation, a plurality of cover support members 100 are coupled to the cover support coupling members 202a, 202b, and 202c on the bottom 200b of cover 200. A cover support member 100 is positioned on the cover support coupling member 202a such that securing lip 202aa extends into coupling passageway 104 and the plurality of guide arms 108a and 108b on cover support member 100 are positioned in guide apertures 202ad and 202ac, respectively, as illustrated in FIG. 5b. The cover support member 100 may then be coupled to the cover 200 by, for example, roll-riveting, so as to provide a rivet-free connection, where the securing lip 202aa is bent such that it engages the securing surface 106 on cover support member 100. Cover support members 100 couple to the cover support coupling members 202b and 202c in substantially the same manner as to cover support coupling member 202a, described above with respect to FIGS. 5b and 5c. With the plurality of cover support member 100 coupled to the cover 200 and the guide arms 108a and 108b positioned in their respective guide apertures such as 202ad and 202ac, respectively, the cover support members 100 are substantially centrally located on the cover 200 between the sides 200e and 200f with the plurality of securing lips 102c and 102d on each cover support member 100 extending from their respective cover support member 100 and toward the sides 200e and 200f of the cover 200.

Figure 6B:
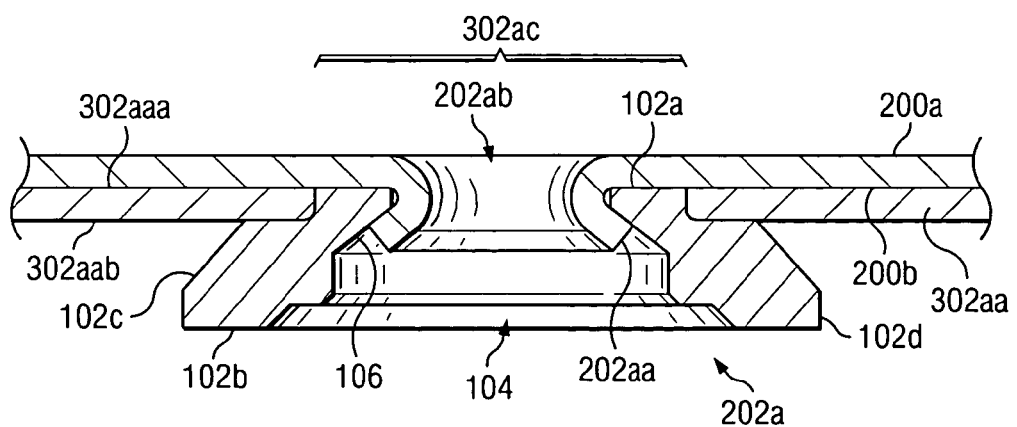
FIG. 6b is a cross sectional view illustrating an embodiment of the cover support member of FIG. 2c coupled to the cover support receiving member of FIG. 4c.
Figure 5D:
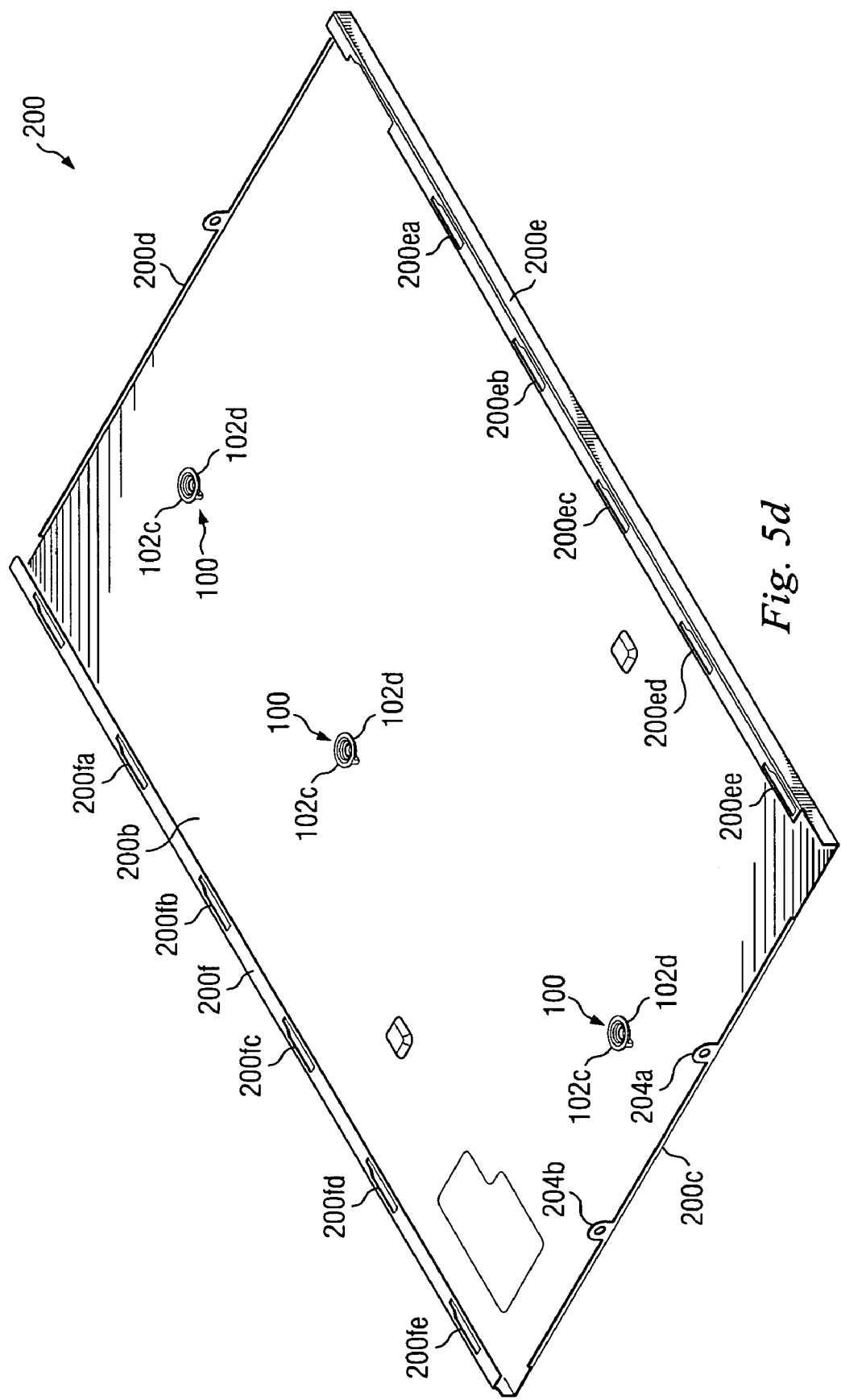
FIG. 5d is a perspective view illustrating an embodiment of a plurality of the cover support members of FIG. 2c coupled to the cover of FIG. 3b.
Figure 6A:
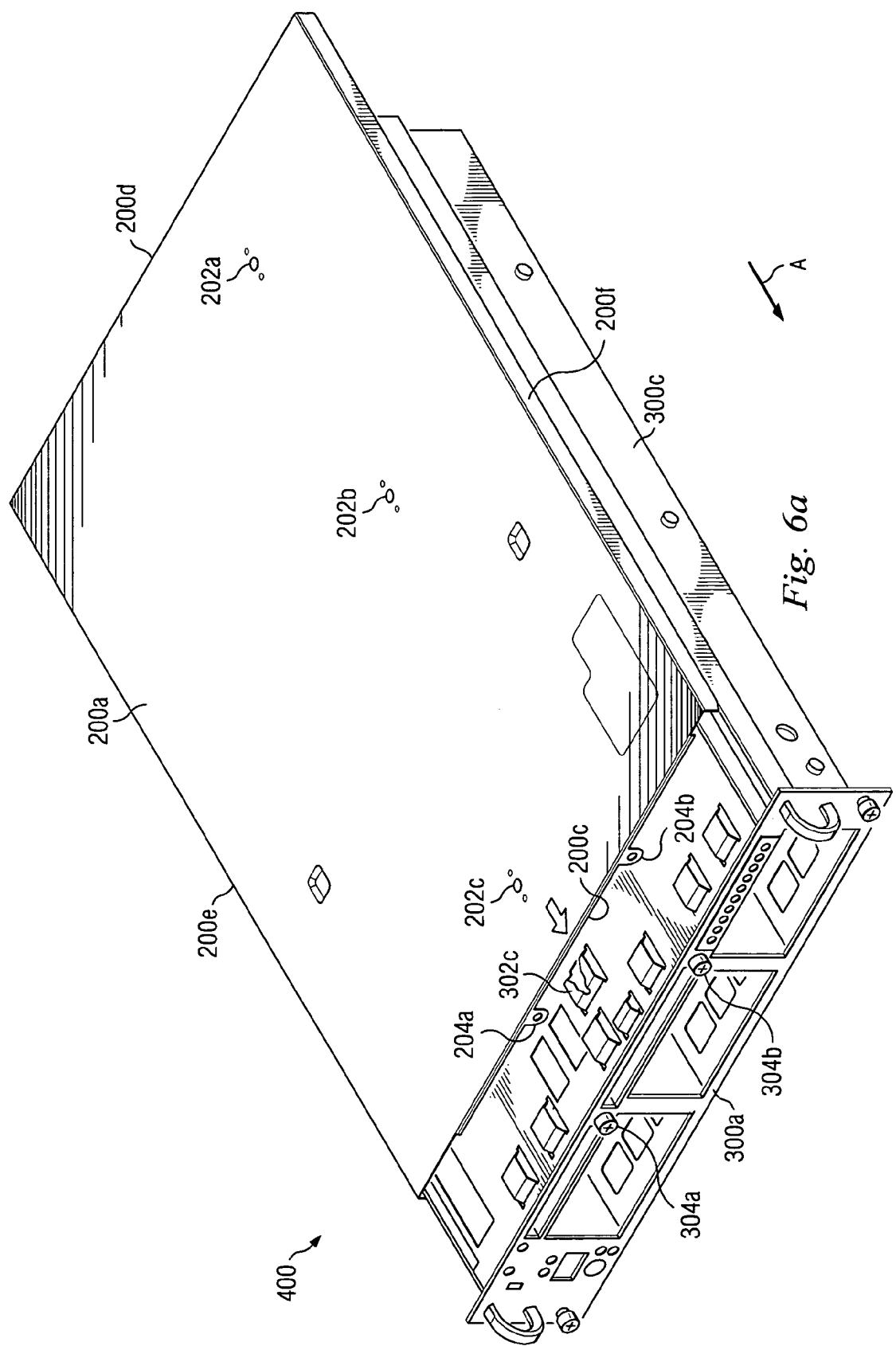
Figure 6C:
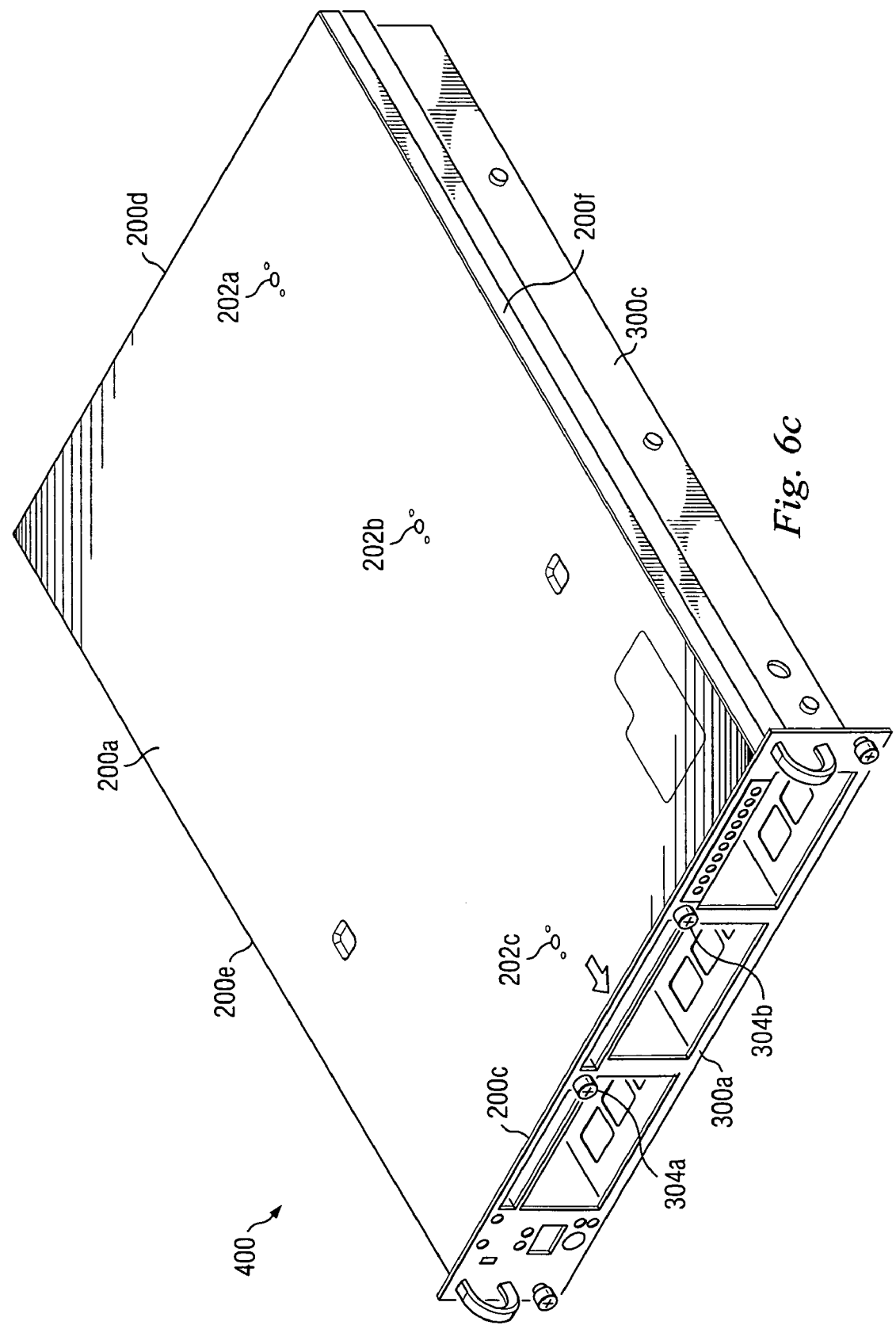

Referring now to FIGS. 2c, 3b, 4a, 4b, 5d, 6a, 6b, and 6c, in operation, the cover 200 is positioned over the chassis 300 such that coupling apertures 200fe, 200fd, 200fc, 200fb, and 200fa on side 200f of cover 200 line up with cover coupling tabs 300ca, 300cb, 300cc, 300cd, and 300ce, respectively, on the side 300c of chassis 300, and the coupling apertures 200ee, 200ed, 200ec, 200eb, and 200ea on the side of cover 200 line up with the respective cover coupling tabs (not shown) on the side 300d of the chassis. The cover 200 is then lowered towards the chassis 300 such that the cover coupling tabs on the chassis 300 engage their respective coupling apertures on the cover 200, as illustrated in FIG. 6a. With the cover coupling tabs engaging the coupling apertures, each of the cover support members 100 on cover support coupling members 202a, 202b, and 202c are positioned adjacent the cover support receiving members 302a, 302b, and 302c, respectively. The cover 200 is then moved in a direction A relative to the chassis 300, which results in the cover support member 100 in cover support coupling member 202a to enter the entry passageway 302ab on cover support receiving member 302a. Further movement of cover 200 in direction A results in the cover support member 100 entering the securing passageway 302ac and the securing lips 102c and 102d on cover support member 100 engaging the bottom surface 302aab of cover support receiving member 302a, as illustrated in FIG. 6b. With securing lips 102c and 102d on cover support member 100 engaging the cover support receiving member 302a, the guide arm 108a on cover support member 100 is positioned in the guide arm channel 302ad. Cover support members 100 in cover support coupling members 202b and 202c on cover 200 engage cover support receiving members 302b and 302c in the same manner as cover support member 100 in cover support coupling member 202a engages cover support receiving member 302a, described above with reference to FIG. 6b. With cover support members 100 in cover support coupling members 202a, 202b, and 202c engaging cover support receiving members 302, 302b, and 302c, respectively, the front 200c of cover 200 engages the font 300a of chassis 300, and the cover 200 is substantially centrally supported between sides 200e and 200f. The engagement of the cover coupling tabs on sides 300c and 300d of chassis 300 with the coupling apertures on the sides 200e and 200f of the cover couples the sides 200e and 200f of the cover to the sides 300c and 300d, respectively, of the chassis 300. The securing members 304a and 304b on the front 300a of chassis 300 may then engage the securing tabs 204a and 204b on the cover 200 in order to secure the cover 200 to the chassis 300, as illustrated in FIG. 6c. The support member coupling aperture 202ab, which results from the coupling of the cover support member 100 to the cover 200, results in a smaller hole in the cover 200 relative to the hole which results when conventional methods are used to support the cover 200, which reduces EMI concerns. In an embodiment, when a non-metal material such as, for example, plastic, is used for the cover support member 100, the support interface between the cover 200 and the chassis 300 results in reduced acoustic levels. Thus, chassis cover support apparatus is provided which is operable to control deformation and vibration of the cover 200 when it is coupled to the chassis 300. In an embodiment, the chassis 300, cover 200, and cover support members 100 provide a chassis cover support apparatus 400. In an embodiment, the chassis cover support apparatus 400 may include a rack mounted server, and a plurality of the chassis cover support apparatus 400 may be mounted in a conventional rack known in the art.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A computer chassis cover supporting apparatus comprising:
   a chassis having a plurality of chassis sides and including a cover support receiving member positioned centrally between the chassis sides;
   a cover including a plurality of cover sides which is operable to couple to the chassis by sliding engagement of the plurality of cover sides with the plurality of chassis sides; and
   a rivet-free connection between a cover support member and the cover, the cover support member being roll riveted to the cover and centrally located between the cover sides, whereby in response to the sliding engagement of the cover sides with the chassis sides, the cover support member engages the cover support receiving member.

2. The apparatus of claim 1 wherein the cover support member is made from a non-metal material.

3. The apparatus of claim 1 wherein the cover support member is made from a plastic.

4. The apparatus of claim 1 wherein the engagement of the cover support member and the cover support receiving member is operable to control deformation of the cover.

5. An information handling system comprising:
   a chassis having a plurality of chassis sides and including a cover support receiving member substantially centrally located between the chassis sides;
   a processor mounted in the chassis;
   a cover including a plurality of cover sides which is operable to couple to the chassis by sliding engagement of the plurality of cover sides with the plurality of chassis sides; and
   a rivet-free connection between a cover support member and the cover, the cover support member being roll riveted to the cover and substantially centrally located between the cover sides, whereby in response to the sliding engagement of the cover sides with the chassis sides, the cover support member couples to the cover support receiving member.

6. The system of claim 5 wherein the chassis includes a plurality of cover support receiving members which are substantially centrally located between the chassis sides.

7. The system of claim 6 wherein a plurality of cover support members are coupled to the cover and substantially centrally located between the cover sides.

8. The system of claim 5 wherein the cover support member is made from a non-metal material.

9. The system of claim 5 wherein the cover support member is made from a plastic.

10. The system of claim 5 wherein the coupling of the cover support member and the cover support receiving member is operable to control deformation of the cover.

11. The system of claim 5 wherein the coupling of the cover support member and the cover support receiving member is operable to control vibration of the cover.

12. A computer chassis cover supporting apparatus comprising:

a chassis;

a cover operable to couple to the chassis by slidingly engaging the chassis;

a rivet-free connection between a cover support member and the cover, the cover support member being roll riveted to the cover; and means for supporting the cover, including a cover support receiving member provided to couple with the support member, whereby in response to sliding engagement of the cover and the chassis the means for supporting the cover is operable to control deformation and vibration of the cover.

13. The apparatus of claim 12 wherein the means for supporting the cover is substantially centrally located on the chassis and the cover.

14. A method for supporting a computer chassis cover comprising:

providing a chassis having a plurality of chassis sides and including a cover support receiving member substantially centrally located between the chassis sides;

positioning a cover on the chassis, the cover having a plurality of cover sides and including a rivet-free connection between a cover support member and the cover, the cover support member being roll riveted to the cover and substantially centrally located between the cover sides;

slidingly engaging the cover sides with the chassis sides to couple the cover to the chassis; and supporting the cover by coupling the cover support member with the cover support receiving member in response to the sliding engagement of the cover sides with the chassis sides.

15. The method of claim 14 wherein the supporting the cover includes controlling deformation in the cover.

16. The method of claim 14 wherein the supporting the cover includes controlling vibration in the cover.

* * * * *